United States Patent [19]

Kolb et al.

[11] 4,300,979
[45] Nov. 17, 1981

[54] GROWTH OF ALPO₄ CRYSTALS

[75] Inventors: Ernest D. Kolb, New Providence; Robert A. Laudise, Berkeley Heights, both of N.J.

[73] Assignee: Bell Telephone Laboratories, Incorporated, Murray Hill, N.J.

[21] Appl. No.: 203,405

[22] Filed: Nov. 3, 1980

[51] Int. Cl.³ .............................................. C30B 7/10
[52] U.S. Cl. ........................... 156/623 R; 156/DIG. 1
[58] Field of Search ..................... 156/623 R, DIG. 61

[56] References Cited

U.S. PATENT DOCUMENTS 3,567,643  3/1971  Flanigen et al. ..................... 156/623
3,634,044  1/1972  Parker ............................. 156/623 R
3,723,337  3/1973  Yancy ................................. 156/623
4,247,358  1/1981  Aucoin et al. .................. 156/623 R

FOREIGN PATENT DOCUMENTS 4002300  9/1979  Japan ......................... 156/DIG. 61

OTHER PUBLICATIONS

Pamplin, *Crystal Growth*, Second Edition, vol. 16, Permagon Press (1980), pp. 464–466.

*Primary Examiner*—O. R. Vertiz
*Assistant Examiner*—Wayne A. Langel
*Attorney, Agent, or Firm*—Peter V. D. Wilde

[57] ABSTRACT

AlPO₄ crystals are isomorphic with quartz and are expected therefore to have several crystal orientations in which the elastic (piezoelectric) constants are relatively insensitive to temperature. The piezoelectric coupling coefficients of AlPO₄ are approximately three times those of quartz. Hydrothermal growth techniques to date have been marginal, and all have employed H₃PO₄ as the hydrothermal solution. We describe using HCl as the hydrothermal solution and demonstrate the superiority of HCl from the standpoint of solubility and consequent crystal growth rate.

10 Claims, 3 Drawing Figures

GROWTH OF ALPO4 CRYSTALS

BACKGROUND OF THE INVENTION

Due to close similarity in crystal structure to quartz, $AlPO_4$ has attracted considerable attention recently as a new piezoelectric material for traditional resonator applications. Quartz has become the most important technological piezoelectric material by virtue of the existence of several quartz crystal orientations that produce zero dependence of frequency on temperature. Because of the exceedingly close resemblance in crystal structure between quartz and $AlPO_4$, similar kinds of zero temperature coefficient orientations are predicted for crystals of $AlPO_4$. Another reason for the interest in $AlPO_4$ is the high coupling efficiency obtainable with this material. The coupling coefficients for $AlPO_4$ are approximately three times those of quartz.

The predominant $AlPO_4$ crystal structure is patterned directly after the quartz structure with Al and P atoms replacing the Si atoms. The striking similarity between the two crystals can be attributed to the small size difference between Si and Al or P. However, the elastic constants are quite different and the temperature dependence of the elastic constants are not well developed. Information regarding the elastic properties of various $AlPO_4$ crystal cuts is given in *IEEE Transactions on Sonics and Ultrasonics*, Vol. SU-23, No. 2, March 1976, pp. 127-135, *Journal of Applied Physics*, Vol. 48, No. 3, March 1977, pp. 887-892.

$AlPO_4$ is synthesized by hydrothermal techniques. Conventional hydrothermal approaches have been unsuccessful so far in reproducibly growing crystals having the size and quality of hydrothermally grown quartz. However, following extensive efforts by us, useful piezoelectric crystals of $AlPO_4$ were prepared hydrothermally using phosphoric acid as the hydrothermal solvent. See E. D. Kolb and R. A. Laudise, *Journal of Crystal Growth*, 43, (1978) pp. 313-319. This effort followed earlier ones of others, along similar lines, using the same growth solution (see, e.g., J. M. Stanley, *Industrial and Engineering Chemistry*, 46, (1954) page 1684, and W. von Jahn and E. Kordes, *Chem. Erde*, (1953) page 75).

Because of the limited success of prior efforts, the need exists for alternative procedures for preparing crystals of aluminum orthophosphate that offer potential for achieving the goal of large, high quality crystals comparable to routinely synthesized quartz crystals.

BRIEF SUMMARY OF THE INVENTION

We have discovered a new hydrothermal synthesis process for growth of aluminum phosphate crystals. The hallmark of the process is the use of hydrochloric acid as the hydrothermal medium. We have established that the solubility of $AlPO_4$ in HCl is greater than in $H_3PO_4$, and that $AlPC_4$ is a stable phase in HCl. We have demonstrated efficient growth kinetics of $AlPO_4$ from HCl solutions, and have found that wall and spontaneous nucleation is less likely in this medium than in $H_3PO_4$.

DETAILED DESCRIPTION

Figure 1:
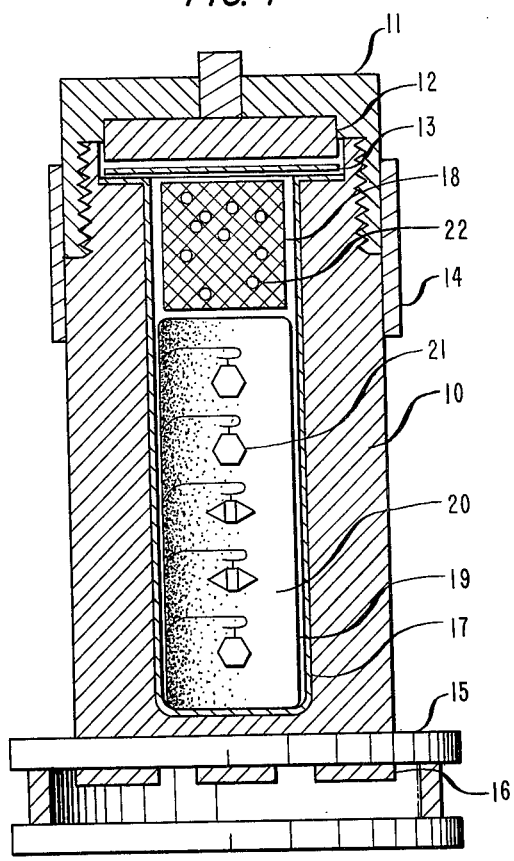
FIG. 1 is a schematic view of a hydrothermal growth apparatus useful for conducting the process of the invention.

Demonstrations of effective hydrothermal growth of $AlPO_4$ were conducted in a Morey autoclave as represented schematically in FIG. 1. The apparatus consists generally of a steel casing 10, cap 11, sealing plunger 12, sealing disc 13, and band heater 14. The autoclave is shown resting on a stainless steel hotplate 15 provided with strip heaters 16. Various heating arrangements may be used. Two heating units were used in our runs to give greater control over the temperature uniformity between the top and bottom of the autoclave, or control of the temperature differential from top to bottom, depending on the type of process used in a given run. Within the autoclave is a liner 17, a screen basket 18 for containing nutrient material, and a seed frame 19. These elements, and other elements exposed to the hydrothermal medium, are made of, or coated with, platinum or suitable noble metal, teflon, or other suitable corrosion resistant material to withstand the corrosive hydrothermal medium. That medium, as indicated earlier and as indicated at 20 in FIG. 1, is an HCl solution. Seed crystals 21 are suspended from the seed frame in the hydrothermal medium. Nutrient material 22 is placed in the nutrient basket 18. Further details of the hydrothermal apparatus are given in *Journal of Crystal Growth*, supra.

The hydrothermal process used to demonstrate the growth of $AlPO_4$ by the process of the invention is influenced by the fact that $AlPO_4$ has a negative coefficient of solubility under the conditions described, so that growth occurs in the hot region of the autoclave. The same is true of prior art processes for growing $AlPO_4$ from $H_3PO_4$ solutions, but is in contrast with the common hydrothermal processes, e.g., for quartz synthesis. The process otherwise resembles generally the quartz growth technique. $AlPO_4$ is isostructural with alpha-quartz and undergoes the same phase change (at approximately 584 degrees C.) to the tridymite form. This indicates the use of a hydrothermal rather than a flux growth technique and imposes an upper limit on the hydrothermal growth temperature.

The following are recommendations for the various process parameters. To our knowledge none are absolutely critical but any one or more may be useful in defining an effective process.

TEMPERATURE

Below about 150 degrees C., solubility of $AlPO_4$ in the HCl hydrothermal solution increases so rapidly with decreasing temperature that the growth kinetics become difficult to control. While high growth rates are desirable from an economic standpoint, our extensive experience with hydrothermal processes has established that very high growth rates equate with deterioration of crystal quality. Therefore we recommend temperatures in excess of 150 degrees C. Moreover there is evidence pointing to the formation of the hydrate $AlPO_4.2H_2O$ at temperatures below 150 degrees (see E. Z. Arlidge, V. C. Farmer, B. D. Mitchell, and W. A. Mitchell, *Journal of Applied Chemistry*, 13, (1973) page 197. The upper operating temperature limit is imposed by the phase change at 584 degrees C. that was mentioned earlier. Solubility above 400 degrees C. nearly vanishes and the growth rates are uninteresting. From our investigations use of temperatures in the temperature range of 150 to 400 degrees C. is possible and temperatures in the range of 150 to 275 degrees C. appear most advantageous.

Degree of fill: The degree of fill for adequate growth of reasonable quality crystals will most likely fall in the range of 70-90 percent. We recommend operation in the range 78-86 percent and most of our data has been collected at fills of 80-84 percent. The degree of fill determines the operating pressure, and the solubility of $AlPO_4$ in our hydrothermal medium is weakly dependent on pressure. Consequently, pressure can be varied to control growth rate independent of temperature. However, within the ranges discussed here, differences are not expected to be dramatic. Pressures above 20 Kpsi are inconvenient to use and appear to produce little further increase in solubility in the temperature range of interest. In fact, solubility of $AlPO_4$ changes very little above 10 Kpsi at typical operating temperatures.

Growth solution: The hydrothermal growth solution according to the invention is aqueous HCl with a molarity in the range of 1.5 to 8.0. Solubility of $AlPO_4$ in an HCl solution more dilute than 1.5 M is very low. At concentrations above 8.0 it becomes difficult to adjust the conditions to avoid dissolving the seeds.

Figure 2:
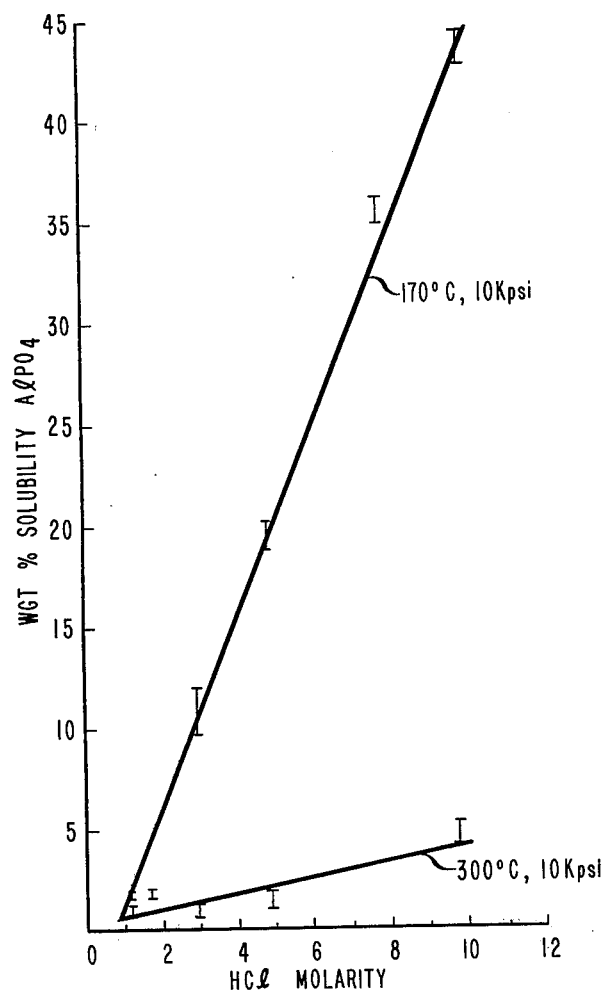
FIG. 2 is a plot of weight percent solubility of $AlPO_4$ as ordinate vs. molarity of HCl as abscissa, at two typical pressures.
Figure 3:
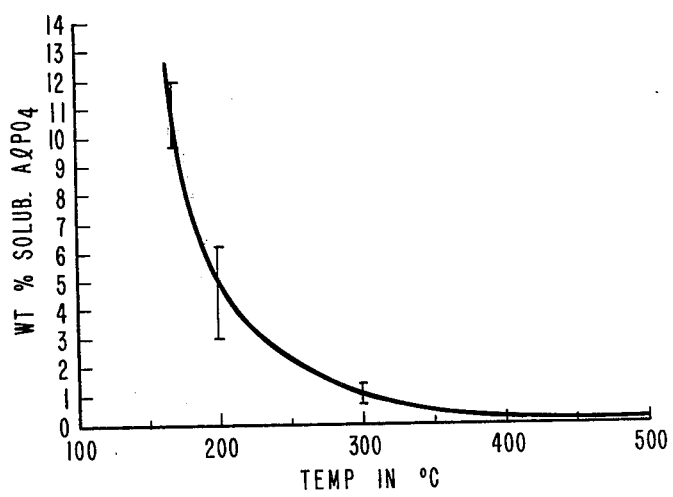
FIG. 3 is a plot of solubility of $AlPO_4$ vs. temperature for a typical HCl hydrothermal solution.

The extent of solubility of $AlPO_4$ in HCl can be appreciated from the curve of FIG. 2, which plots weight percent solubility of $AlPO_4$ as ordinate vs. molarity of HCl as abscissa for the two pressures indicated. A similar plot of solubility vs. temperature in 3.03 M HCl at 10 Kpsi is shown in FIG. 3.

By way of comparison with $H_3PO_4$ hydrothermal solutions, the solubility of $AlPO_4$ in 6 M $H_3PO_4$ at 170 degrees C. and 10 Kpsi is less than 10 percent, while FIG. 2 shows the corresponding value of solubility in HCl to be more than 20 percent. In 3 M $H_3PO_4$ under the same conditions, the solubility is approximately 2 percent, whereas in 3 M HCl it is above 10 percent.

Several process runs were performed to demonstrate the efficacy of this hydrothermal growth technique. In most of the runs growth was from an isothermal medium. Growth was effected by raising the temperature of a solution saturated with $AlPO_4$. Nutrient was used to initially saturate the solution and was retained during the process to ensure saturation and the viability of the seed during the initial stages.

Seeds were prepared by cutting plates with faces corresponding to one of the three major crystallographic orientations X, Y, or Z (according to IRE nomenclature) and growth rate in each of these directions was measured.

The results of our runs are tabulated in the following Table.

TABLE I

| Run No. | Time Days | Nutrient $AlPO_4$ | HCl Molarity | Fill % | *Temp °C. Start Finish | **Δt Start Finish | Temp. Incr. °C./day | ***Yield (mils/day) Seed # |
|---|---|---|---|---|---|---|---|---|
| 1 | 8 | 30-40 mesh 20 gms | 3.05 | 82 | 151 164 | ~2.0 | 2° | All Seeds & Nutrient Lost |
| 2 | 9 | 20 gms 30-40 mesh | 1.525 | 82 | 150 164 | ~.2 ~.2 | 2° | 1. (Z) 7.2 2. (Y) 0.69 3. (X) 0.15 4. (Z) 12.3 |
| 3 | 22 | 20 gms 30-40 mesh 7.0 gms powder | 1.525 | 82 | 150 192 | 0.9 1.0 | 2° | 1. (Z) .56 2. (Y) .88 3. (X) .84 4. (Z) .47 |
| 4 | 21 | 20 gms 30-40 mesh 7.0 gms powder | 1.525 | 82 | 151.3 249.3 | 1.3 2.2 | 5° | 1. (Z) 1.17 2. (Y) 1.24 3. (X) 2.21 4. (Z) 1.7 |
| 5 | 20 | 20 gms 30-40 mesh 7 gms powder | 1.525 | 82 | 152.2 292.8 | 2.1 4.2 | 7.5° | 1. (Z) 1.76 2. (Y) 0.21 3. (X) 2.1 4. (Z) 2.63 |
| 6 | 14 | 23 gms 30 mesh 5 gms powder | 1.525 | 82 | 151.4 272.9 | 1.4 2.6 | 10° | 1. (Z) 2.47 2. (Y) .285 3. (X) 2.58 4. (Z) 4.25 |
| 7 | 9 | 16.7 gms 30 mesh 4 gms powder | 8.00 | 82 | 196.2 267.9 | 47.9 58.2 | 10° | 1. dissolved away 2. dissolved away |
| 8 | 14 | 21.78 gms 30 mesh 5 gms powder | 1.525 | 82 | 151 364.4 | 2.0 5.3 | 15° | 1. (Z) 2.26 2. (Y) .61 3. (X) 1.88 4. (Z) 3.5 |
| 9 | 16 | 20 gms 30 mesh 5 gms powder | 1.54 | 82 | 149.6 292.3 | 0.7 2.5 | 10° | 1. (Y) 0.7 2. (X) 3.1 3. (Z) 2.0 |
| 10 | 8 | 20.0 gms 30 mesh 8 gms powder | 3.05 | 82 | 150.9 301.2 | 1.5 3.0 | 20° | 1. (Y) 1.687 2. (X) 10.8 3. (Z) 15.36 |
| 11 | 8 | 22.0 gms 30 mesh 8 gms | 4.5 | 82 | 150.7 301.7 | 2.3 4.0 | 20° | 1. (Y) 2.9 2. (X) 13.84 3. (Z) 28.2 |

TABLE I-continued

| Run No. | Time Days | Nutrient AlPO$_4$ | HCl Molarity | Fill % | *Temp °C. Start / Finish | **Δt Start / Finish | Temp. Incr. °C./day | ***Yield (mils/day) Seed # |
|---|---|---|---|---|---|---|---|---|
| 12 | 13 | powder 21.6 gms 30 mesh 5 gms | 4.5 | 82 | 151.4 / 332.7 | 2.2 / 5.3 | 15° | 1. (Z) 21.4<br>2. (Z) dissolved away<br>3. (Z) 17.3 |
| 13 | 12 | powder 19.27 gms 30 mesh 5 gms | 6.0 | 82 | 150.8 / 316.9 | 1.0 / 2.8 | 15° | 1. (Z) 42.1<br>2. (X) dissolved away<br>3. (Z) 34.2 |
| 14 | 11 | powder 19.28 gms 30 mesh | 6.0 | 82 | 150.3 / 246.4 | 1.2 / 2.4 | 10° | 1. (Z) dropped down<br>2. (Y) 3.36<br>3. (Z) 21.55 |

*Temperature measured at bottom of autoclave.
**Temperature at bottom of autoclave - temperature at top of autoclave °C.
***Seed orientations are:
X = (11$\bar{2}$0)
Y = (10$\bar{1}$0)
Z = (0001)

Although we chose to demonstrate the process using primarily isothermal growth conditions the preferred commercial process is the well known Δt approach in which growth is effected by creating a temperature differential between the seed and the nutrient of 5 to 75 degrees, or more typically, 10 to 40 degrees, using controls similar to those shown in FIG. 1. The Δt process is simply a continuous implementation of the batch procedure used in our runs. Description of this implementation in other Δt hydrothermal processes may be found in U.S. Pat. Nos. 3,356,463, 3,201,209, 2,785,058. As indicated earlier, we found that under the operating conditions we investigated, the solubility coefficient of AlPO$_4$ in HCl is negative, and growth is effected by heating the hydrothermal solution. However, we do not discount the possibility that conditions exist where the coefficient is positive, and growth can be induced in the conventional manner by cooling the hydrothermal solution, or maintaining a temperature gradient between hot nutrient and a cooler seed.

We chose also to demonstrate our process by growth on X-, Y- and Z-cut seeds. From our results we can predict that acceptable growth will occur also on the well known minor rhombohedral face, known as a z-cut according to IRE convention.

Various additional modifications and extensions of this invention will become apparent to those skilled in the art. All such variations and deviations which basically rely on the teachings through which this invention has advanced the art are properly considered to be within the spirit and scope of this invention.

We claim:

1. Process for growth of AlPO$_4$ crystals comprising disposing a seed in a hydrothermal medium comprising AlPO$_4$ solute in a solvent, maintaining the hydrothermal medium at a pressure and temperature sufficient to effect growth of AlPO$_4$ on the seed, the invention characterized in that the hydrothermal medium comprises an aqueous solution of HCl.

2. The process of claim 1 in which the hydrothermal medium is maintained at a temperature in the range of 150 to 400 degrees C.

3. The process of claim 2 in which the hydrothermal medium is contained in a pressure vessel and initially fills from 70 to 90 percent of the volume of the vessel.

4. The process of claim 3 in which nutrient material is added to the hydrothermal solution and growth is effected by the step of maintaining a temperature difference between the nutrient material and the seed.

5. The process of claim 4 in which the seed is maintained at a temperature higher than the nutrient material.

6. The process of claim 4 in which the temperature difference is in the range of 5 to 75 percent centigrade.

7. The process of claim 3 in which growth is effected by the step of heating the hydrothermal solution.

8. The process of claim 7 in which nutrient AlPO$_4$ material is added to the hydrothermal solution.

9. The process of claim 1 in which the aqueous solution contains 1.5 M to 8 M HCl.

10. The process of claim 1 in which the seed is an AlPO$_4$ crystal having an X-, Y-, Z- or z- crystallographic orientation.

* * * * *